(12) United States Patent
Kasahara et al.

(10) Patent No.: US 7,849,382 B2
(45) Date of Patent: Dec. 7, 2010

(54) MEMORY CONTROL CIRCUIT, NONVOLATILE STORAGE APPARATUS, AND MEMORY CONTROL METHOD

(75) Inventors: Tetsushi Kasahara, Osaka (JP); Tomoaki Izumi, Osaka (JP); Masahiro Nakanishi, Kyoto (JP); Kazuaki Tamura, Osaka (JP); Kiminori Matsuno, Osaka (JP); Yoshihisa Inagaki, Osaka (JP); Manabu Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 906 days.

(21) Appl. No.: 11/568,564

(22) PCT Filed: May 12, 2005

(86) PCT No.: PCT/JP2005/008681

§ 371 (c)(1),
(2), (4) Date: Feb. 12, 2007

(87) PCT Pub. No.: WO2005/111812

PCT Pub. Date: Nov. 24, 2005

(65) Prior Publication Data

US 2008/0049504 A1    Feb. 28, 2008

(30) Foreign Application Priority Data

May 19, 2004    (JP) .............................. 2004-149316

(51) Int. Cl.
G11C 29/00    (2006.01)

(52) U.S. Cl. ...................................................... 714/763
(58) Field of Classification Search .................. 714/763
See application file for complete search history.

(56) References Cited

U.S. PATENT DOCUMENTS

| 5,406,529 | A | * | 4/1995 | Asano ..................... 365/230.03 |
| 5,798,995 | A | * | 8/1998 | Fukushima et al. ........... 386/98 |
| 6,185,134 | B1 | | 2/2001 | Tanaka |
| 6,549,459 | B2 | | 4/2003 | Higuchi |
| 6,608,784 | B2 | | 8/2003 | Kanamori et al. |

FOREIGN PATENT DOCUMENTS

JP    6-131886    5/1994
JP    2000-173289    6/2000

(Continued)

OTHER PUBLICATIONS

U.S. Appl. No. 10/597,650 to Kasahara et al., filed Aug. 2, 2006.

(Continued)

*Primary Examiner*—Scott T Baderman
*Assistant Examiner*—Enam Ahmed
(74) *Attorney, Agent, or Firm*—Greenblum & Bernstein, P.L.C.

(57) ABSTRACT

An address at which a writing error occurs is held, and after a completion of a series of writings, the data of the held address is read. Then, a faulty-block processing is performed only for the addresses, for which it is determined that retry of writing is required, thereby preventing an increase of faulty-blocks. This can suppress the problem that when a writing is performed in a particular flash memory, a writing error frequently occurs and a large number of faulty blocks occur.

15 Claims, 4 Drawing Sheets

FOREIGN PATENT DOCUMENTS

| | | |
|---|---|---|
| JP | 2002-108720 | 4/2002 |
| JP | 2002108720 A * | 4/2002 |
| JP | 2002-133892 | 5/2002 |
| JP | 2003-076615 | 3/2003 |

OTHER PUBLICATIONS

U.S. Appl. No. 10/598,307 to Nakanishi et al., filed Aug. 24, 2006.
U.S. Appl. No. 11/568,470 to Tamura et al., filed Oct. 30, 2006.

English language Abstract of JP 2003-076615.
English language Abstract of JP 2000-173289.
English language Abstract of JP 2002-133892.
English language Abstract of JP 6-131886.
English language Abstract of JP 2002-108720.

* cited by examiner

FIG. 2

| Block address | | In use or Not in use (1 : not, 0 : in use) |
|---|---|---|
| Physical address | Logical address | |
| 0 | – | 1 |
| 1 | 3 | 0 |
| 2 | 4 | 0 |
| 3 | 5 | 0 |
| 4 | – | 1 |
| 5 | 1 | 0 |
| 6 | – | 0 |
| 7 | – | 1 |
| 8 | 6 | 0 |
| 9 | – | 1 |
| 10 | – | 1 |
| 11 | – | 1 |
| ⋮ | ⋮ | ⋮ |

MEMORY CONTROL CIRCUIT, NONVOLATILE STORAGE APPARATUS, AND MEMORY CONTROL METHOD

TECHNICAL FIELD

The present invention relates to a memory control circuit, nonvolatile storage apparatus, and memory control method which are characterized by error processing in writing data to a rewritable nonvolatile memory.

BACKGROUND ART

In recent years, a memory card and equipment which carry a rewritable nonvolatile memory have been spreading. Since the memory card especially has better resistance to vibration, the memory card is expected to be increasingly used.

A flash memory is a typical rewritable nonvolatile memory. Generally, data is written in units of pages and data is erased in units of erase blocks. The erase block ordinary consists of a plurality of the pages. In a following description, the page and erase block are referred to as a block. It is managed in units of blocks whether the flash memory is in use or not in use, for example, "1" is written as management data with respect to a block not in use and when data is written to the block not in use, the management data is changed from "1" to "0".

Generally, the flash memory fails to write data on rare occasions. For this reasons, the flash memory is provided with a function to read status showing whether data writing is normal writing or abnormal writing. After data writing, it is required to determine by reading this status whether data writing has been normally executed. When writing error occurs, a corresponding management data of a block is changed from "1" to "0" in order not to be selected as a writing block again.

Concerning writing error of the flash memory mentioned above, an art described in Patent document 1 is known.

Patent document 1: Unexamined Patent Publication 2002-108720 (paragraphs 0003 to 0004).

DISCLOSURE OF INVENTION

Problems to be Solved by the Invention

In order not to select a memory cell occurring writing error for an object to be written again, conventional flash memory has executed a processing that sets the block to a bad block on the management table. But, recently, a flash memory able to reuse a memory cell even when data writing is not normally executed has been appearing. In this flash memory, if all the memory cells occurring writing error are set to be the bad blocks as conventional flash memory, a bad block may be produced in large amounts.

The present invention is made to solve the problems described above and aims to realize a memory control circuit, nonvolatile storage apparatus, and memory control method which reduce generation of a bad block in a memory card.

Means to Solve the Problems

To solve the problems, a memory control circuit of the present invention is a memory control circuit for a rewritable nonvolatile memory comprising: a first management table for storing data writing conditions of said nonvolatile memory in every data writing as management data; a second management table for copying management data of said first management table in every completion of data writing in predetermined units; a write part for writing new data in block units to said nonvolatile memory based on management data of said first management table; a management table update part for updating management data of said first management table so that rewriting to said written block is forbidden; a determination part for determining whether said data writing is normally executed or not; an error address registration part for registering addresses of blocks which are determined as said data writing is not normally executed by said determination part; an error correction part for sequentially reading data of address registered in said error address registration part after completion of writing in predetermined units, and for detecting and correcting error; and a termination control part for normally terminating after copying management data of said first management table to said second management table when writing in predetermined unit is set to be valid based on a data error state of address registered in said error address register, and for abnormally terminating after copying management data of said second management table to said first management table when writing in predetermined unit is set to be invalid based on a data error state of address registered in said error address register.

Here, when error at least m bits is detected, said termination control part may order said write part to retry of writing data whose error is corrected by said error correction part to different block in said nonvolatile memory and validates the writing by ordering said management table update part to update management data of the first management table.

Here, said termination control part may order said management table update part to set a block occurring error at least n bits (n>=m) to be a bad block.

Here, when it is determined that there is at least one error which exceeds correction ability, said termination control part may abnormally terminate.

Here, said termination control part may order said management table update part to set a block occurring error exceeding correction ability to be a bad block after copying management data of the second management table to the first management table and abnormally terminates after copying management data of said first management table to the second management table.

To solve the problems, a nonvolatile storage apparatus of the present invention is a nonvolatile storage apparatus comprising: a rewritable nonvolatile memory; a first management table for storing data writing conditions of said nonvolatile memory in every data writing as management data; a second management table for copying management data of said first management table in every completion of data writing in predetermined units; a write part for writing new data in block units to said nonvolatile memory based on management data of said first management table; a management table update part for updating management data of said first management table so that rewriting to said written block is forbidden; a determination part for determining whether said data writing is normally executed or not; an error address registration part for registering addresses of blocks which are determined as said data writing is not normally executed by said determination part; an error correction part for sequentially reading data of address registered in said error address registration part after completion of writing in predetermined units, and for detecting and correcting error; and a termination control part for normally terminating after copying management data of said first management table to said second management table when writing in predetermined unit is set to be valid based on a data error state of address registered in said error address register, and for abnormally terminating after copying management data of said second management table to said first management table when writing in predetermined unit is set to be invalid based on a data error state of address registered in said error address register.

In addition, a memory control method on the present invention is a memory control method for rewritable nonvolatile memory comprising steps of: storing data writing conditions of said nonvolatile memory in every data writing in a first management table as management data; copying management data of said first management table in every completion of data writing in predetermined units to a second management table; writing new data in block units to said nonvolatile memory based on management data of said first management table; updating management data of said first management table so that rewriting to said written block is forbidden; determining whether said data writing is normally executed or not by a determination part; registering addresses of blocks which is determined as said data writing is not normally executed by said determination part to an error address registration part; sequentially reading data of address registered in said error address registration part after completion of writing in predetermined units, and for detecting and correcting error by an error correction part; and normally terminating after copying management data of said first management table to said second management table when writing in predetermined unit is set to be valid based on a data error state of address registered in said error address register, and abnormally terminating after copying management data of said second management table to said first management table when writing in predetermined unit is set to be invalid based on a data error state of address registered in said error address register.

Here, retry of writing data whose error is corrected by said error correction part to different block in said nonvolatile memory may be ordered and the writing by ordering to update management data of the first management table may be invalidated when error at least m bits is detected.

Here, management data of said first management table may be updated to set a block occurring error at least n bits (n>=m) to be a bad block.

Here, processing may be abnormally terminated when it is determined that there is at least one error which exceeds correction ability.

Here, management data of said first management table may be updated to set a block occurring error exceeding correction ability to be a bad block after copying management data of the second management table to the first management table and processing may be abnormally terminated after copying management data of said first management table to the second management table.

EFFECTIVENESS OF THE INVENTION

The present invention can prevent an increase of bad blocks since written data is reread even if a nonvolatile memory easily occurring a writing error is used and a bad block processing is executed only when a predetermined number or more errors are occurred. In addition, frequency of error termination to writing instruction from a host can be reduced by executing retry of writing of correctable data to other blocks even when error occurs in data. By the method described above, if the nonvolatile memory easily occurring a writing error is used, a function of a nonvolatile storage apparatus is achieved and price reduction of a non-volatile memory can be realized.

BRIEF DESCRIPTION OF DRAWINGS

FIG. 2 is an explanation view showing a configuration of a first management table and second management table in the memory control circuit of the present embodiment and an example of management data listed on the tables.

DESCRIPTION OF REFERENCE NUMERALS

Figure 1:
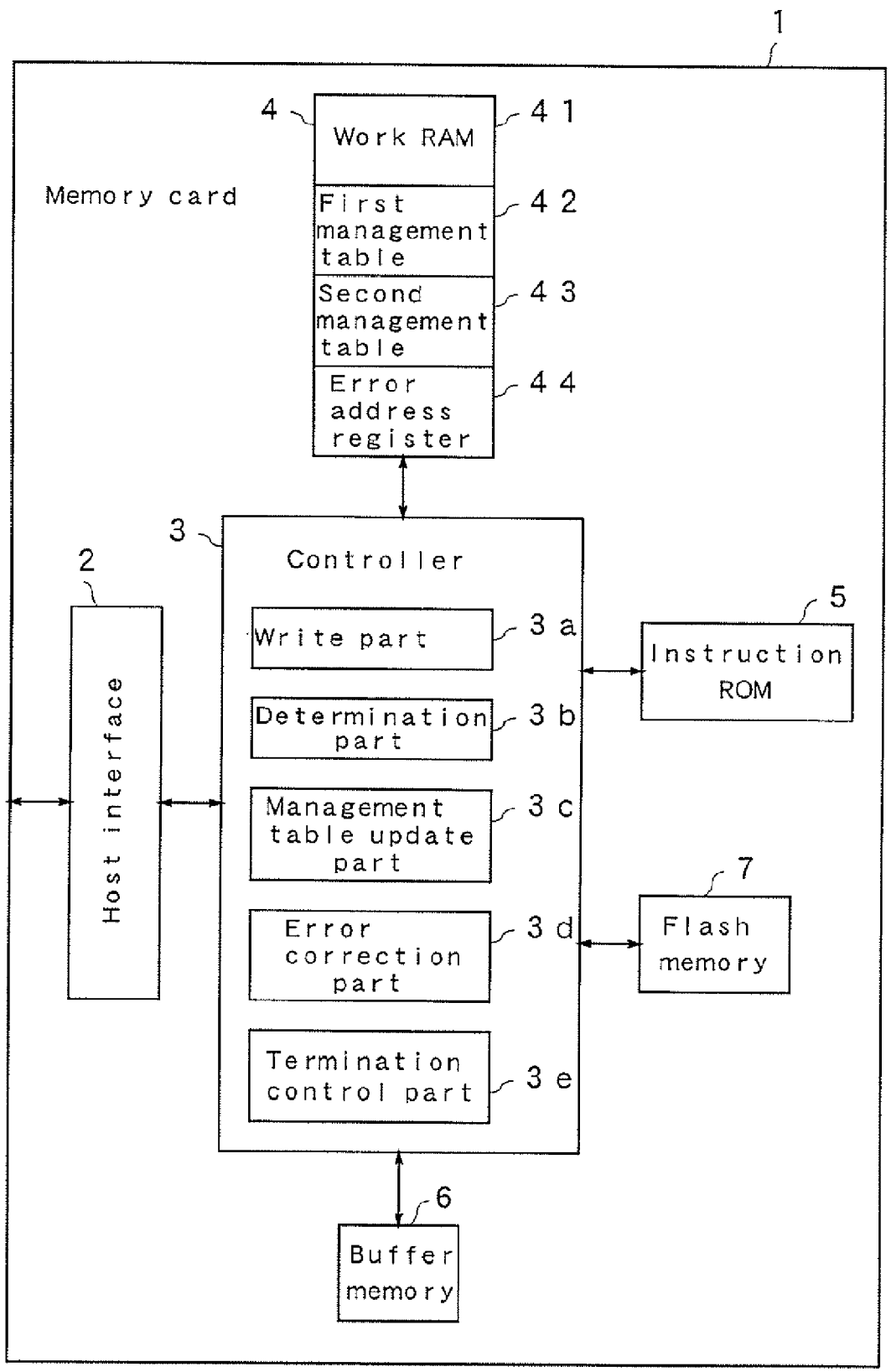
FIG. 1 is a configuration view of a memory card including a memory control circuit according to an embodiment of the present invention.

1 Memory card
2 Host interface
3 Controller
3a Write part
3b Determination part
3c Management table update part
3d Error correction part
3e Termination control part
4 RAM
5 Instruction ROM
6 Buffer memory
7 Flash memory
41 Work RAM
42 First management table
43 Second management table
44 Error address register

BEST MODE FOR CARRYING OUT THE INVENTION

A memory card that is a nonvolatile storage apparatus in an embodiment of the present invention and its memory control circuit will be described below with referring figures. FIG. 1 is a block diagram showing a configuration of a memory card 1 including the memory control circuit according to the embodiment of the present invention. In FIG. 1, the memory card 1 is used by attaching to an electronic device (not shown) such as a digital still camera (DSC) and personal computer (PC). The memory card 1 mainly includes a host interface 2, controller 3, RAM 4, instruction ROM 5, buffer memory 6, and rewritable nonvolatile memory, for example, a flash memory 7. A part including the controller 3, RAM 4, instruction ROM 5, and buffer memory 6 is referred to as a memory control circuit.

The host interface 2 executes an interface with an electronic device body (hereinafter referred to as a host) attaching the memory card 1, and sends and receives read/write data and commands and clocks for various controls to the flash memory 7. The controller 3 controls the whole of the memory card 1 and is composed of a micro processor (MPU). The controller 3 has various program execution parts described below. The controller 3 controls the RAM 4, flash memory 7, and buffer memory 6 according to control programs stored in the instruction ROM 5. A write part 3a, determination part 3b, management table update part 3c, error correction part 3d, and termination control part 3e are there as the program execution parts.

The instruction ROM 5 is a read only nonvolatile memory and stores a control program for achieving functions of the abovementioned program execution parts. The RAM 4 is composed of a volatile memory and has memory areas which are called work RAM 41 that is a work area of the controller 3, first block management table 42, second block management table 43, and error address register 44.

The first block management table 42 and second management table 43 are management tables for retaining a use state of the flash memory 7 as management data. An example of management data in the management table is shown in FIG. 2. The management data in the management table records logical block address (physical address) and logical block address (logical address) corresponding to this, whether each block address is in use or not, and so on. Data area of the management data has same format in the both tables but their update timings are different. The management data in the first management table 42 is updated in every data writing to a block, while the management data in the second management table is updated in predetermined writing unit such as a unit of data transfer from the host. Concretely, when transfer of some data from the host is completed, management data of the first management table 42 is copied to the second management table 43. This means that the first management table 42 shows a present data storage state, while the second management table 43 shows a previous data storage state.

Generally, reading and writing to a block of physics (physical block) of the flash memory 7 are executed after designating an address of a block of logic (logical block) given from the host. A role of the first management table 42 is this conversion of a logical address of this logical block to a physical address of a physical block. FIG. 2 shows correspondence relationships between physical blocks as block addresses and logical addresses, and shows whether the physical addresses (blocks designated by addresses) are in use or not.

For instance, in an example shown in FIG. 2, it is written whether physical blocks are in use or not and logical address numbers allotted to each physical block are written. When "0" is listed on a column showing whether in use or not, there is a case where logical address is not written in spite of in use. The example of FIG. 2 shows that a physical address "6" corresponds to the state mentioned above and that the physical block is a bad block. In this case, this block is not selected as a writing address. The buffer memory 6 is a memory for temporarily retaining data transferred from the host. In addition, the flash memory 7 is a nonvolatile memory for writing the data transferred from the host.

Figure 3:
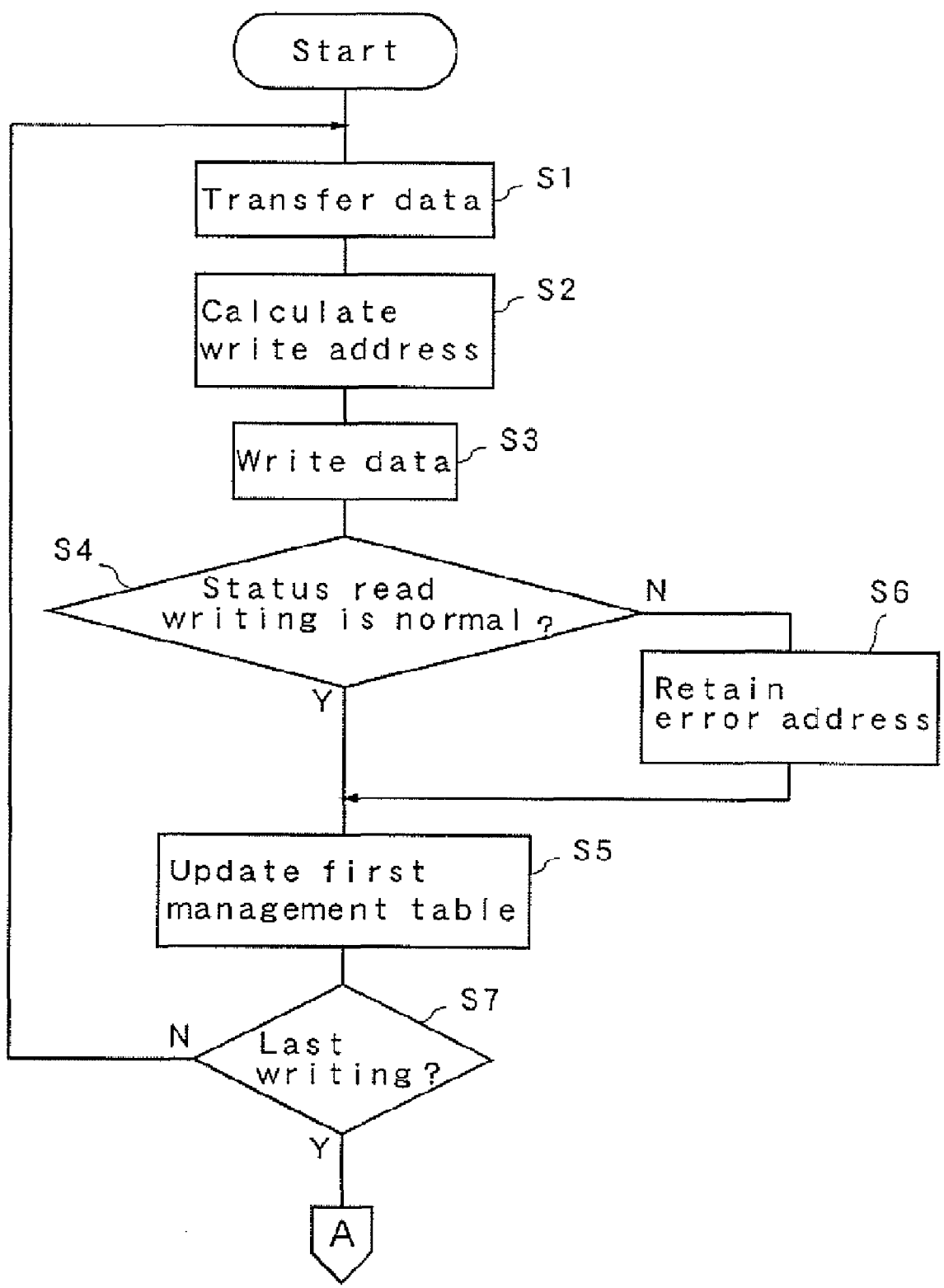
FIG. 3 is a flow chart showing an operation (No. 1) of writing processing in the memory control circuit of the present embodiment.
Figure 4:
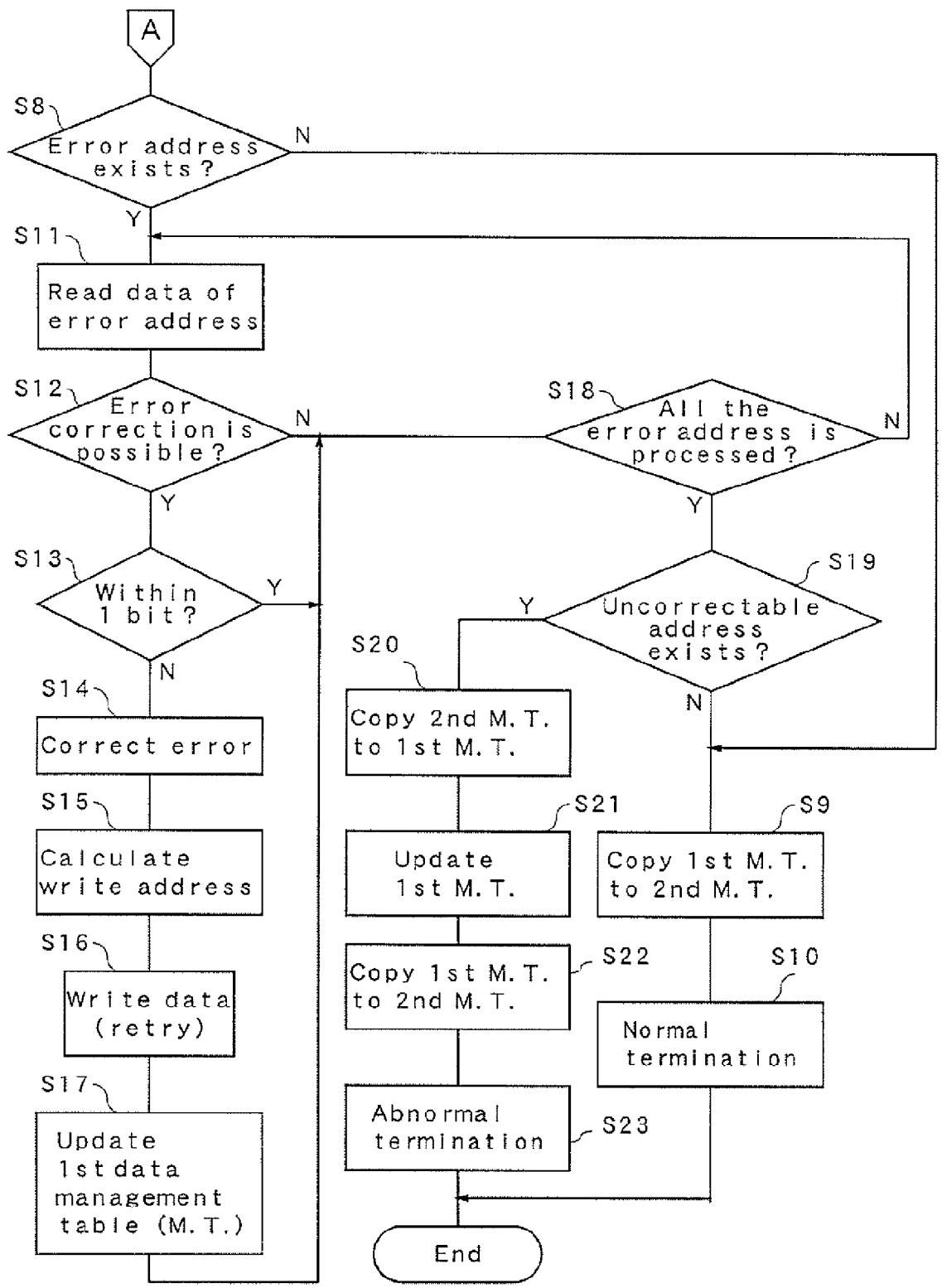
FIG. 4 is a flow chart showing an operation (No. 2) of writing processing in the memory control circuit of the present embodiment.

Data write processing of the memory card 1 composed as mentioned above will be explained with referring to flow charts shown in FIG. 3 and FIG. 4. The flow charts shown in FIG. 3 and FIG. 4 are put in practice by the controller 3 of FIG. 1. First, at step S1 shown in FIG. 3, when receiving a write command from the host via the host interface, the controller 3 temporarily retains data transferred from the data in the buffer memory 6 and transfers data to the flash memory 7 in block units.

Next, at step S2, the controller 3 refers to block management data recorded in the first management table 42, and searches a writable physical address, namely an unused physical address whose management data showing in use or not in use is "1", that is, calculates a write address. And next, at step S3, data is written in the physical block searched in step S2. This step S3 achieves a function of the write part 3*a* for writing new data in block units to the flash memory 7 of the nonvolatile memory based on management data of the first management table 42.

Next, at step S4, a status read command is issued to the flash memory 7 and it is determined whether a processing status of data writing is normally executed or not according to a reply from the flash memory 7. This step S4 achieves a function of the determination part 3*b* for determining whether data writing is normally executed or not. When it is determined that data writing is normally executed at step S4, corresponding management data on the first management table 42 is changed from "1" to "0" and logical block number that is logical address is written at step S5.

On the contrary, when it is determined that data writing is not normally executed at step S4, processing progresses to step S6. After registering address occurring error to error address register 44, corresponding management data on the first management table 42 is changed from "1" to "0" and the logical block number that is logical address occurring error is written at step S5. When update of the first management table 42 is completed at step S5, processing progresses to step S7. At step 7, when this writing is not the last writing from the host, a step returns to step S1 and processing from step S1 to step S7 is repeated.

At step S7, when the writing is the last writing from the host, processing progresses to step S8 in FIG. 4 and it is determined whether error address exists in the error address register 44 or not. If error address is not retained here, processing progresses to step S9, then management data of the first management table 42 is copied to the second management table 43, and writing is normally terminated (step S10).

On the contrary, if error address is retained at step S8 of FIG. 4, processing progresses to step S11, then data of error address is read. At next step S12, the error correction part 3*d* determines whether error is correctable or not. If the error is correctable, processing progresses to step S13 and it is determined whether the number of the error is within, for example, 1 bit or not, and if within 1 bit, the error is left. On the other hand, if the error is over 1 bit at step S13, processing progresses to step S14 and error of read data is corrected.

Next, the controller 3 refers to each block's management data written in the first management table 42, and searches a writable physical address, that is, calculates a writing address. In next step S16, data is written to the physical block searched at step S15. Next, at step S17, corresponding management data on the first management table 42 is changed from "1" to "0" and logical block number as logical address is written. In addition, management data corresponding to an address having error on the first management table 42 is changed from "1" to "0" and a bad block processing is executed. Contents of the first management table 42 are updated in this manner.

When a processing of step S17 completes, when it is determined that data error is within 1 bit at step S13, and when it is determined that error correction is impossible at step S12, a process progresses to step S18. When other error addresses remain in the error address register 44 at step S18, processing returns to step S11 but when processing to all error addresses completes, processing progresses to step S19.

It is checked whether uncorrectable address exists or not and when uncorrectable address does not exist, processing progresses to step S9. When uncorrectable address exists, processing progresses to step S20. At step S9, management data of the first management table 42 is copied to the second management table 43. Writing processing normally terminates in this manner (Step S10).

On the other hand, when error correction of read data is impossible, management data of the second management table 43 is copied to the first management table 42 to invalidate all the series of writing at step S20. This means that the first management table 42 is back to the previous state. At next step S21, management data corresponding to uncorrectable address on the first management table 42 is changed from "1"

to "0" and a bad block processing is executed. Next, management data updated at step S21 of the first management table 42 is copied to the second management table 43 at step S22. Write processing abnormally terminates in this manner (step S23).

In processing described above, step S5, step S17, and step S21 achieve a function of the management table update part 3c for updating management data to prevent rewriting to a written block. In addition, step S11, step S12, step S13, and step S14 achieve a function of the error correction part 3d for sequentially reading data of address retained by the error address register 44 and detecting and correcting error after completion of writing in predetermined units. Further, step S9, step S10, step S19, step S20, step S21, step S22, and step S23 achieve a function of the termination control part 3e for copying management data of the first management table 42 to the second management table 43 and normally terminating when the writing in predetermined units is valid according to a data error state of address retained in the error address register 44, and for copying management data of the second management table 43 to the first management table 42 and abnormally terminating when the writing in predetermined units is invalid according to a data error state of address retained in the error address register 44.

According to the embodiment as described above, since bad block processing is executed only for an address uncorrectable at step S12 and address determined as retry of writing at step S13, increase of bad blocks can be prevented.

When error is equal to or over 2 bits, retry of writing is executed and bad block processing is executed in the embodiment described above. That is to say, it is supposed to be m=2 and n=2, but n may be equal to or larger than m, for example, it may be m=1 and n=2, or m=2 and n=3.

To simplify the description, only an uncorrectable address detected first is set to a bad block and processing abnormally terminates, however, data of all addresses retained in error address may be read and all uncorrectable addresses may be set to bad blocks.

A case applied for a memory card having a nonvolatile memory has been described. However, the other nonvolatile memories incorporated into, for example, an electronic device can be carried out in a similar manner and the present invention is not limited in a memory card. In addition, the RAM 4 is composed of a volatile memory, however, the RAM 4 may be a nonvolatile memory, and may be a combination of a volatile memory and nonvolatile memory.

INDUSTRIAL APPLICABILITY

A memory control circuit and memory control method of the present invention are suitably used in a nonvolatile storage apparatus including a controller and nonvolatile memory. And they can be applied for various electronic device incorporating a nonvolatile memory.

The invention claimed is:
1. A memory control circuit for a rewritable nonvolatile memory comprising:
a first management table that stores management data, which indicates a data writing condition of the nonvolatile memory at every data writing by blocks;
a second management table that stores management data, which is a copy of the management data of said first management table upon completion of data writing of a predetermined unit of data, wherein the predetermined unit includes a plurality of blocks;
a writer that writes the predetermined unit of data in the blocks of the nonvolatile memory based on the management data of said first management table;
a management table updater that updates the management data of said first management table so that rewriting to the written blocks is forbidden;
a determiner that determines whether or not the data writing to each block is normally executed;
an error address register that registers an address of a block for which said determiner determines that the data writing is not normally executed;
an error corrector that reads the data in the block identified by the address registered in said error address register, after completion of the writing of the predetermined unit of data, and that detects and corrects an error in the read data; and
a termination controller that normally terminates, after copying the management data of said first management table to said second management table when the writing of the predetermined unit of data is set to be valid, based on a state of the error detected by said error corrector, and that abnormally terminates, after copying the management data of said second management table to said first management table when the writing of the predetermined unit of data is set to be invalid, based on the state of the error detected by said error corrector, so that the management data of the first management table is reverted to a state before the data writing of the predetermined unit of data is performed.

2. The memory control circuit according to claim 1, wherein
when an error of at least m bits is detected by the error corrector, said termination controller orders said writer to retry writing data, in which the error is corrected by said error corrector, to a different block in the nonvolatile memory, and orders said management table updater to update the management data of said first management table.

3. The memory control circuit according to claim 2, wherein
said termination controller orders said management table updater to set a block having an error of at least n bits (n>=m) to be a bad block.

4. The memory control circuit according to claim 1, wherein
when it is determined that there is at least one error that exceeds correction ability of the error corrector, said termination controller abnormally terminates.

5. The memory control circuit according to claim 4, wherein
said termination controller orders said management table updater to set a block having an error exceeding correction ability of the error corrector to be a bad block after copying the management data of said second management table to said first management table, and abnormally terminates after copying the management data of said first management table to said second management table.

6. A nonvolatile storage apparatus comprising:
a rewritable nonvolatile memory;
a first management table that stores management data, which indicates a data writing condition of said nonvolatile memory at every data writing by blocks;
a second management table that stores management data, which is a copy of the management data of said first management table upon completion of data writing of a predetermined unit of data, wherein the predetermined unit includes a plurality of blocks;

a writer that writes the predetermined unit of data in the blocks of said nonvolatile memory based on the management data of said first management table;

a management table updater that updates the management data of said first management table so that rewriting to the written blocks is forbidden;

a determiner that determines whether or not the data writing to each block is normally executed;

an error address register that registers an address of a block for which said determiner determines that the data writing is not normally executed;

an error corrector that reads the data in the block identified by the address registered in said error address register, after completion of the writing of the predetermined unit of data, and that detects and corrects an error in the read data; and a termination controller that normally terminates, after copying the management data of said first management table to said second management table, when the writing of the predetermined unit of data is set to be valid, based on a state of the error detected by said error corrector, and that abnormally terminates, after copying the management data of said second management table to said first management table, when the writing of the predetermined unit of data is set to be invalid, based on the state of the error detected by said error corrector, so that the management data of the first management table is reverted to a state before the data writing of the predetermined unit of data is performed.

7. The nonvolatile storage apparatus according to claim 6, wherein when an error equal to or larger than m bits is detected, said termination controller orders said writer to retry writing data, in which the error is corrected by said error corrector, to a different block in the nonvolatile memory, and orders said management table updater to update the management data of said first management table.

8. The nonvolatile storage apparatus according to claim 7, wherein said termination controller orders said management table updater to set a block having an error of at least n bits (n>=m) to be a bad block.

9. The nonvolatile storage apparatus according to claim 6, wherein when it is determined that there is at least one error that exceeds correction ability of the error corrector, said termination controller abnormally terminates.

10. The nonvolatile storage apparatus according to claim 9, wherein said termination controller orders said management table updater to set a block having an error exceeding correction ability of the error corrector to be a bad block after copying the management data of said second management table to said first management table, and abnormally terminates after copying the management data of said first management table to said second management table.

11. A memory control method for rewritable nonvolatile memory comprising:

storing management data, indicating a data writing condition of the nonvolatile memory at every data writing by blocks in a first management table;

storing management data, which is a copy of the management data of the first management table upon completion of data writing of a predetermined unit of data, to a second management table, the predetermined unit of data including a plurality of blocks;

writing the predetermined unit of data in the blocks of the nonvolatile memory based on the management data of the first management table;

updating the management data of the first management table so that rewriting to the written blocks is forbidden;

determining whether or not the data writing to each block is normally executed;

registering an address of a block for which it is determined that the data writing is not normally executed, to an error address register;

reading data in the block identified by the address registered in the error address register, after completion of the writing of the predetermined unit of data, detecting and correcting an error in the read data;

normally terminating, after copying the management data of the first management table to the second management table when the writing of the predetermined unit of data is set to be valid, based on a state of the detected error; and abnormally terminating, after copying the management data of the second management table to the first management table when the writing of the predetermined unit of data is set to be invalid, based on the state of the detected error, so that the management data of the first management table is reverted to a state before the data writing of the predetermined unit of data is performed.

12. The memory control method according to claim 11 further comprising:

when an error of at least m bits is detected, ordering retry of writing data, in which the error is corrected, to a different block in the nonvolatile memory, and updating the management data of the first management table.

13. The memory control method according to claim 12 further comprising:

updating the management data of the first management table to set a block having an error of at least n bits (n>=m) to be a bad block.

14. The memory control method according to claim 11 further comprising:

abnormally terminating when it is determined that there is at least one error that exceeds error correction ability of the correcting.

15. The memory control method according to claim 14 further comprising:

updating the management data of the first management table to set a block having an error exceeding error correction ability of the correcting to be a bad block after copying the management data of the second management table to the first management table; and abnormally terminating after copying the management data of the first management table to the second management table.

* * * * *